United States Patent
Watanabe (10) Patent No.: US 11,513,549 B2
(45) Date of Patent: Nov. 29, 2022

(54) ACTIVATION CIRCUIT FOR ACTIVATING A DRIVE TARGET

(71) Applicant: SONY SEMICONDUCTOR SOLUTIONS CORPORATION, Kanagawa (JP)

(72) Inventor: Hiroyuki Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 109 days.

(21) Appl. No.: 17/046,937

(22) PCT Filed: Jan. 30, 2019

(86) PCT No.: PCT/JP2019/003051
§ 371 (c)(1),
(2) Date: Oct. 12, 2020

(87) PCT Pub. No.: WO2019/207878
PCT Pub. Date: Oct. 31, 2019

(65) Prior Publication Data
US 2021/0048837 A1 Feb. 18, 2021

(30) Foreign Application Priority Data
Apr. 25, 2018 (JP) .............................. JP2018-083839

(51) Int. Cl.
*G05F 3/26* (2006.01)
*H03F 3/347* (2006.01)

(52) U.S. Cl.
CPC ................ *G05F 3/262* (2013.01); *G05F 3/26* (2013.01); *H03F 3/347* (2013.01)

(58) Field of Classification Search
CPC ............. G05F 3/262; G05F 3/26; H03F 3/347
(Continued)

(56) References Cited

U.S. PATENT DOCUMENTS 7,388,423 B1 * 6/2008 Lorenz ................... G05F 1/468
327/543
8,188,785 B2 * 5/2012 Iacob ....................... G05F 1/10
327/543
(Continued)

FOREIGN PATENT DOCUMENTS

CN 102915070 A 2/2013
CN 103858348 A 6/2014
(Continued)

OTHER PUBLICATIONS

Vadim Ivanov, "Analog Techniques for Nano-power Circuits", ISSCC 2015 Tutorial, Feb. 22, 2015, 63 pages.
(Continued)

*Primary Examiner* — Yemane Mehari
(74) *Attorney, Agent, or Firm* — Chip Law Group (57) ABSTRACT

An activation circuit which can realize both of area reduction and current consumption reduction by more preferred embodiments. The activation circuit has an N-type MOS transistor having a gate terminal connected to a ground and having a threshold voltage in a vicinity of 0 V and a resistor interposed between a source terminal of the MOS transistor and a ground, wherein an electric potential of a drain terminal of the MOS transistor is controlled depending on a first signal output from a device serving as a drive target, and transmission of a second signal for activating the device is controlled depending on the electric potential of the drain terminal.

9 Claims, 8 Drawing Sheets

(58) Field of Classification Search
USPC .......................................................... 323/315
See application file for complete search history.

(56) References Cited

U.S. PATENT DOCUMENTS

| | | | | |
|---|---|---|---|---|
| 2007/0164722 | A1* | 7/2007 | Rao .......................... | G05F 3/262 |
| | | | | 323/315 |
| 2013/0033251 | A1* | 2/2013 | Nagatomo .............. | G05F 3/242 |
| | | | | 323/315 |

FOREIGN PATENT DOCUMENTS

| | | | |
|---|---|---|---|
| CN | 103916113 | A | 7/2014 |
| CN | 106027006 | A | 10/2016 |
| JP | 2008-154020 | A | 7/2008 |
| JP | 2013-037435 | A | 2/2013 |

OTHER PUBLICATIONS

International Search Report and Written Opinion of PCT Application No. PCT/JP2019/003051, dated Feb. 26, 2019, 08 pages of ISRWO.

* cited by examiner

ACTIVATION CIRCUIT FOR ACTIVATING A DRIVE TARGET

CROSS REFERENCE TO RELATED APPLICATIONS

This application is a U.S. National Phase of International Patent Application No. PCT/JP2019/003051 filed on Jan. 30, 2019, which claims priority benefit of Japanese Patent Application No. JP 2018-083839 filed in the Japan Patent Office on Apr. 25, 2018. Each of the above-referenced applications is hereby incorporated herein by reference in its entirety.

FIELD

The present disclosure relates to an activation circuit.

BACKGROUND

So-called electronic equipment driven with supply of power has recently diversified. For example, electronic equipment driven by a coin cell(s) for a long period of time and low-power-consumption electronic equipment to which power is supplied by so-called energy harvesting have also been proposed. Some of circuit elements constituting such low-power-consumption electronic equipment include those having power consumption of a nanowatt (nW) level.

The circuit elements which constitute various pieces of electronic equipment include activation circuits. There are various types of activation circuits depending on required specifications. Particularly recently, a type of the activation circuit using an N-type MOS transistor referred to as a so-called Native-NMOS adjusted to have a threshold voltage in a vicinity of 0 V has also been proposed. The activation circuit of the type using the Native-NMOS can realize both of area reduction and current consumption reduction compared with the activation circuits of other types and has drawn attention. For example, Non Patent Literature 1 discloses an example of the activation circuit of the type using the Native-NMOS.

CITATION LIST

Non Patent Literature

Non Patent Literature 1: Vadim Ivanov, "Analog Techniques for Nano-power Circuits," ISSCC 2015 Tutorial, Feb. 22, 2015.

SUMMARY

Technical Problem

Generally, an activation circuit has to stop an activation signal (for example, a current or voltage signal) generated by the activation circuit after a device serving as a target to be activated is activated. On the other hand, in some cases, designing of an activation circuit has to be provided with margins for resistance and current consumption in consideration of variations among elements such as transistors (for example, Native-NMOS). The consideration for the margin may lead to, for example, increase in the size of the activation circuit or increase in the current consumption of the activation circuit.

Therefore, the present disclosure proposes an activation circuit which can realize both of area reduction and current consumption reduction by more preferred embodiments.

Solution to Problem

According to the present disclosure, aAn activation circuit is provided that includes: an N-type MOS transistor having a gate terminal connected to a ground and having a threshold voltage in a vicinity of 0 V; and a resistor interposed between a source terminal of the MOS transistor and a ground, wherein an electric potential of a drain terminal of the MOS transistor is controlled depending on a first signal output from a device serving as a drive target, and transmission of a second signal for activating the device is controlled depending on the electric potential of the drain terminal.

Advantageous Effects of Invention

As described above, according to the present disclosure, the activation circuit which can realize both of area reduction and current consumption reduction by more preferred embodiments is provided.

Note that the above described effects are not necessarily limitative, and any of effects described in the present specification or other effects that can be understood from the present specification may be exerted together with or in place of the above effects.

DESCRIPTION OF EMBODIMENTS

Hereinafter, preferred embodiments of the present disclosure will be described in detail with reference to the accompanying drawings. Note that, in the present specification and the drawings, components having substantially the same functional configuration will be denoted with the same reference numerals and redundant description will be omitted.

Note that the description will be given in the following order.

1. Outlines of Activation Circuit
2. Technical Problems

3. Technical Characteristics
3.1. Operation Principles
3.2. First Configuration Example
3.3. Second Configuration Example
3.4. Supplementary Notes
4. Conclusion 1. Outlines of Activation Circuit First, outlines of an activation circuit will be described with examples. As described above, recently, along with diversification of electronic equipment, low-power-consumption electronic equipment has also been proposed. Some of circuit elements constituting such low-power-consumption electronic equipment include those having power consumption of a nW level. Such circuit elements include activation circuits. There are various types of activation circuits depending on required specifications. Particularly recently, a type of the activation circuit using an N-type MOS transistor referred to as a so-called Native-NMOS adjusted to have a threshold voltage in a vicinity of 0 V has also been proposed.

The Native-NMOS has a property that a channel leakage current of a certain level flows even in a state in which a gate terminal is connected to a ground (GND) since the threshold voltage thereof is in the vicinity of 0 V as described above. In other words, the Native-NMOS has a property that, in a state in which no voltage is applied to the gate terminal thereof, a state between a source and a drain thereof is maintained in the conductive state. The activation circuit of the type using the Native-NMOS can realize both of area reduction and low current consumption by using the above described property of the Native-NMOS compared with the activation circuits of other types and has drawn attention.

Generally, after a device serving as a target to be activated (in other words, a device serving as a drive target) is activated, an activation circuit stops transmission of a signal generated by the activation circuit for activating the device. Examples of the signal generated by the activation circuit for activating the device serving as the drive target include a current or voltage signal. Note that, in the following description, the signal for activating the device serving as the drive target will be also referred to as "activation signal" for the sake of convenience. Therefore, in the following description, the term "activation signal" may include both of current and voltage signals unless otherwise particularly stated and as long as there is no restrictions in terms of circuit configuration. Note that the above described activation signal corresponds to an example of "second signal".

Herein, an example of the activation circuit of the type using Native-NMOS will be described as a comparative example. For example, FIG. 1 is an explanatory diagram for describing an example of a schematic configuration of the activation circuit according to the comparative example and illustrates the example of the configuration of an activation circuit 190 for a drive target, which is a current source circuit 200.

Figure 1:
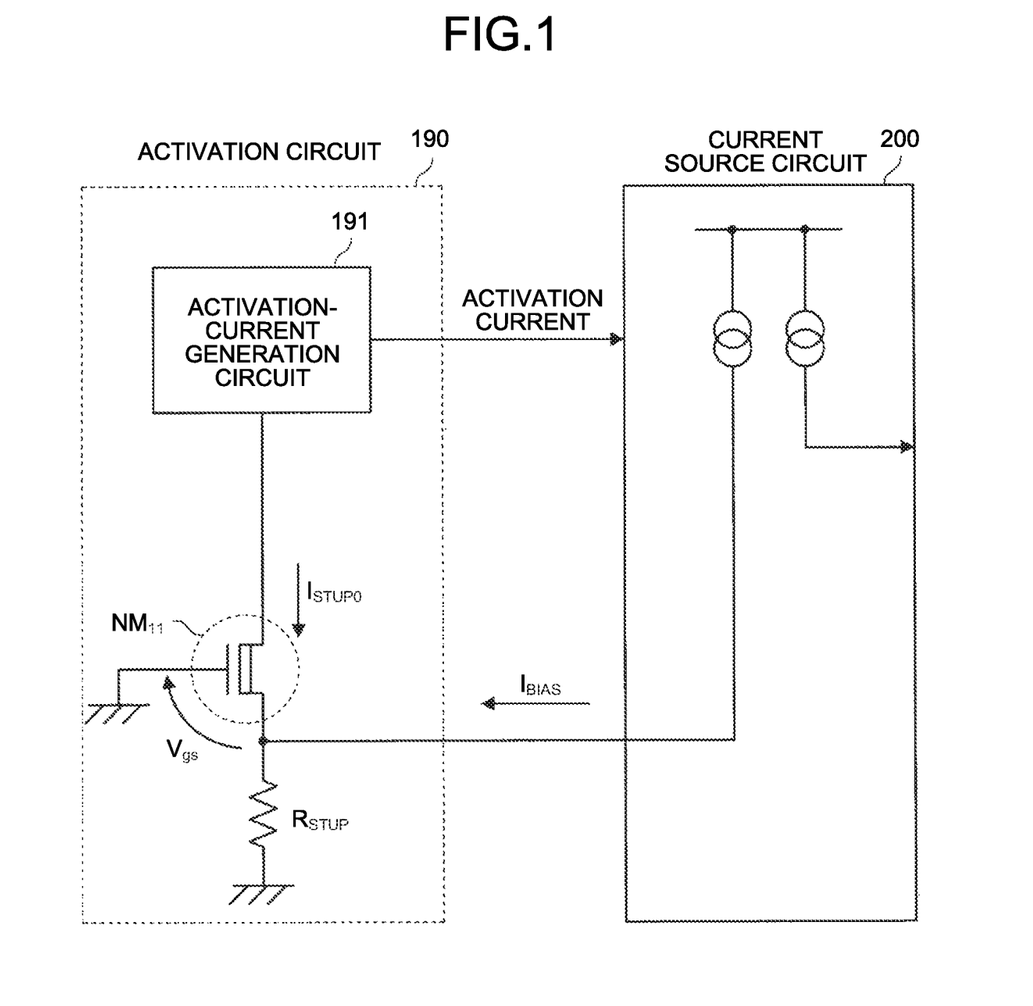
FIG. 1 is an explanatory diagram for describing an example of a schematic configuration of an activation circuit according to a comparative example.

As illustrated in FIG. 1, the activation circuit 190 includes a transistor $NM_{11}$ constituted as a Native-NMOS, a resistor $R_{STUP}$, and an activation-current generation circuit 191. The transistor $NM_{11}$ has a gate terminal electrically connected to a ground (GND) and has a source terminal electrically connected to a ground (GND) via a resistor $R_{STUP}$. Also, the activation-current generation circuit 191 is connected to a drain terminal side of the transistor $NM_{11}$. Also, part of a signal line of the current source circuit 200 to which a bias current IBIAS generated by the current source circuit 200 serving as the drive target flows is electrically connected to a source terminal of the transistor $NM_{11}$. In FIG. 1, a reference sign $I_{STUP0}$ schematically illustrates a drain current of the transistor $NM_{11}$. Also, a reference sign $V_{gs}$ illustrates a gate-source voltage of the transistor NM11. When an activation current (in other words, activation signal) generated in the activation-current generation circuit 191 conducts through the current source circuit 200 in such a configuration, the current source circuit 200 is activated.

Specifically, whether the activation current generated in the activation-current generation circuit 191 conducts through the current source circuit 200 or not is controlled depending on a conductive state in which the source and the drain of the transistor $NM_{11}$ are conductive to each other or a non-conductive state in which the source and the drain are non-conductive to each other. When the transistor $NM_{11}$ becomes the conductive state, the drain current $I_{STUP0}$ conducts through the activation-current generation circuit 191, and the activation current is generated in the activation-current generation circuit 191. When the activation current generated in the activation-current generation circuit 191 conducts through the current source circuit 200, the current source circuit 200 is activated.

Also, along with activation of the current source circuit 200, part of the current (transmitted signal) flowing through the current source circuit 200, in other words, part of the current (signal) output from the current source circuit 200 flows to the source terminal side of the transistor $NM_{11}$ as the bias current $I_{BIAS}$. As a result, a source voltage of the transistor $NM_{11}$ increases, and the gate-source voltage $V_{gs}$ of the transistor $NM_{11}$ decreases along with the increase in the source voltage. Then, when the gate-source voltage $V_{gs}$ becomes lower than a threshold voltage $V_{th}$ of the transistor $NM_{11}$, the transistor $NM_{11}$ transitions from the conductive state to the non-conductive state. Therefore, the flow of the drain current $I_{STUP0}$ in the activation-current generation circuit 191 is restricted, and, as a result, generation of the activation current in the activation-current generation circuit 191 is restricted (or stopped). In other words, the activation circuit 190 becomes an off-state. Note that the current (signal) output from the above described current source circuit 200 like the above described bias current $I_{BIAS}$ corresponds to an example of "first signal".

Herein, an example of a circuit configuration of the activation circuit according to the comparative example will be described. For example, FIG. 2 is an explanatory diagram for describing an example of the circuit configuration of the activation circuit according to the comparative example and illustrates an example of the circuit configuration of the activation circuit 190 in a case in which the current source circuit 200 illustrated in FIG. 1 is constituted as a current source circuit of a so-called self-bias type.

Figure 2:
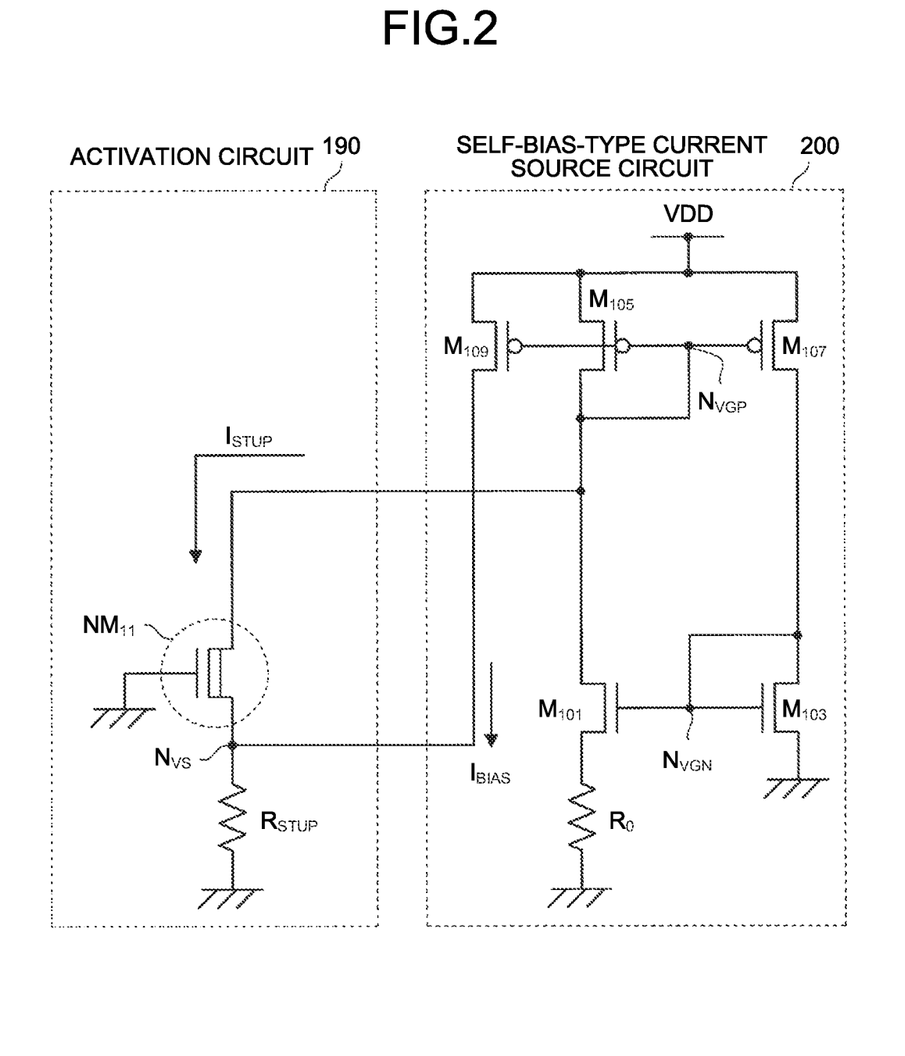
FIG. 2 is an explanatory diagram for describing an example of a circuit configuration of the activation circuit according to the comparative example.

As described above, the current source circuit 200 illustrated in FIG. 2 is constituted as the current source circuit of the self-bias type. Specifically, the current source circuit 200 includes transistors $M_{101}$ and $M_{103}$, which are constituted as N-type MOS transistors, and transistors $M_{105}$, $M_{107}$, and $M_{109}$, which are constituted as P-type MOS transistors.

The transistors $M_{101}$ and $M_{103}$ constitute a current mirror circuit. Specifically, gate terminals of the respective transistors M101 and M103 are electrically connected to each other. The gate and the drain of the transistor M103 are electrically connected to each other. A source terminal of the transistor $M_{101}$ is electrically connected to a ground (GND) via a resistor $R_0$. Also, a source terminal of the transistor $M_{103}$ is electrically connected to the ground (GND).

Also, the transistors $M_{105}$, $M_{107}$, and $M_{109}$ constitute a current mirror circuit. Specifically, gate terminals of the respective transistors $M_{105}$, $M_{107}$, and $M_{109}$ are electrically connected to one another. The gate and the drain of the transistor $M_{105}$ are electrically connected to each other. Source terminals of the respective transistors $M_{105}$, $M_{107}$, and $M_{109}$ are electrically connected to a power source voltage VDD.

In the above described configuration, a drain terminal of the transistor $M_{101}$ and a drain terminal of the transistor $M_{105}$ are electrically connected to each other. Also, a drain terminal of the transistor $M_{103}$ and a drain terminal of the transistor $M_{107}$ are electrically connected to each other.

Also, in the example illustrated in FIG. 2, a signal line branched from the drain terminal side of the transistor $M_{105}$ is electrically connected to the drain terminal side of the transistor $NM_{11}$. Also, a drain terminal side of the transistor $M_{109}$ is electrically connected to the source terminal side of the transistor $NM_{11}$.

In such a configuration, when the power source voltage VDD is applied and the activation circuit 190 becomes an on-state, the activation current $I_{STUP}$ flows so that the current is pulled out from the current source circuit 200 to the activation circuit 190. Specifically, the activation current $I_{STUP}$ flows from the drain terminal side of the transistor $M_{105}$ to the drain terminal side of the transistor $NM_{11}$. As a result, the current source circuit 200 is activated.

Also, when the current source circuit 200 is activated, part of the current output (in other words, output signal) from the current source circuit 200 is supplied to the source terminal side of the transistor $NM_{11}$ as the bias current $I_{BIAS}$, and the electric potential of the source terminal side of the transistor $NM_{11}$ increases. In other words, along with supply of the bias current $I_{BIAS}$, the gate-source voltage $V_{gs}$ of the transistor $NM_{11}$ decreases. Then, when the gate-source voltage $V_{gs}$ becomes lower than the threshold voltage $V_{th}$ in the transistor $NM_{11}$, the transistor $NM_{11}$ transitions to the non-conductive state, and the flow of the activation current ISTUP is therefore shut off. In other words, the activation circuit 190 becomes an off-state.

Figure 3:
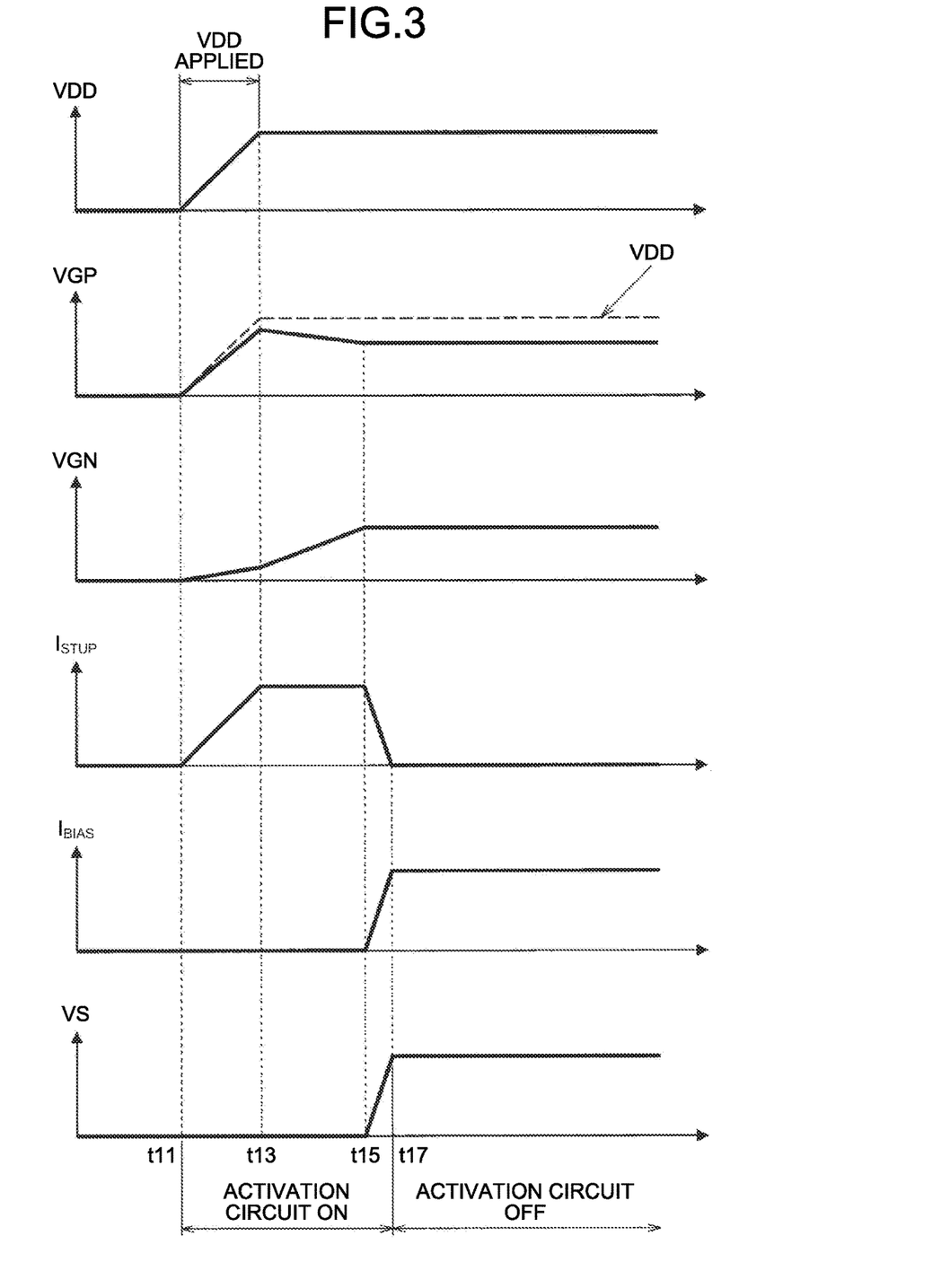
FIG. 3 is a timing chart for describing operation of the activation circuit according to the comparative example.

Herein, with reference to FIG. 3, operation of the activation circuit 190 illustrated in FIG. 2, in other words, operation about activation of the current source circuit 200 will be described in more detail. FIG. 3 is a timing chart for describing the operation of the activation circuit 190 according to the comparative example. Horizontal axes in FIG. 3 represent time. A reference sign VDD represents a voltage value of the power source voltage VDD illustrated in FIG. 2. A reference sign VGP represents the electric potential of a node $N_{VGP}$ in FIG. 2, in other words, the electric potential of the gate terminals of the respective transistors $M_{105}$, $M_{107}$, and $M_{109}$, which constitute the current mirror circuit. A reference sign VGN represents the electric potential of a node $N_{VGN}$ in FIG. 2, in other words, the electric potential of the gate terminals of the respective transistors $M_{101}$ and $M_{103}$, which constitute the current mirror circuit. A reference sign $I_{STUP}$ represents the current value of the activation current $I_{STUP}$ illustrated in FIG. 2. A reference sign $I_{BIAS}$ represents the current value of the bias current $I_{BIAS}$ illustrated in FIG. 2. A reference sign VS represents the electric potential of a node $N_{vs}$ in FIG. 2, in other words, the electric potential of the source terminal of the transistor $NM_{11}$.

In the example illustrated in FIG. 3, the power source voltage VDD is applied at timing t11, and the voltage value of the power source voltage VDD increases in the period from the timing t11 to timing t13. Note that, at this point of time, the electric potential VS of the source terminal of the transistor $NM_{11}$ indicates a vicinity of 0 V.

When the power source voltage VDD is applied, the activation circuit 190 becomes the on-state, the activation current $I_{STUP}$ flows so that the current is pulled out from the current source circuit 200 to the activation circuit 190. In this process, the current value of the activation current $I_{STUP}$ increases along with increase in the voltage value of the power source voltage VDD, and the electric potential VGP of the node $N_{VGP}$ increases along with increase in the current value of the activation current $I_{STUP}$. Then, at the timing t13, the transistors $M_{105}$, $M_{107}$, and $M_{109}$ transition to the conductive state, and the increase in the power source voltage VDD stops. Also, when the transistor $M_{107}$ transitions to the conductive state at the timing t13, the electric potential VGN of the node $N_{VGN}$ electrically connected to the drain terminal side of the transistor $M_{107}$ increases, and the electric potential VGP decreases along with the increase in the electric potential VGN. Also, along with the increase in the electric potential VGN of the node $N_{VGN}$, the transistors $M_{101}$ and $M_{103}$ transition to the conductive state at timing t15, and the increase in the electric potential VGN and the decrease in the electric potential VGP stop. As described above, the activation of the current source circuit 200 is completed, and the signal (drain current) is transmitted between the source and the drain of each of the transistors $M_{101}$, $M_{103}$, $M_{105}$, $M_{107}$, and $M_{109}$, which constitute the current source circuit 200.

When the activation of the current source circuit 200 is completed at the timing t15, the signal transmitted between the source and the drain of the transistor $M_{109}$ is supplied to the source terminal (in other words, the node $N_{VS}$) of the transistor $NM_{11}$ as the bias current $I_{BIAS}$. Along with this supply of the bias current $I_{BIAS}$, the electric potential VS of the source terminal (node $N_{VS}$) of the transistor $NM_{11}$ increases. Also, since the gate-source voltage $V_{gs}$ of the transistor $NM_{11}$ decreases along with the increase in the electric potential VS, the current value of the activation current $I_{STUP}$ decreases along with that. Then, at timing t17, when the gate-source voltage $V_{gs}$ of the transistor $NM_{11}$ becomes lower than the threshold voltage $V_{th}$ of the transistor $NM_{11}$, the transistor $NM_{11}$ transitions to the non-conductive state, and the flow of the activation current $I_{STUP}$ is therefore shut off. In other words, the activation circuit 190 becomes an off-state.

With reference to FIG. 1 to FIG. 3, outlines of the activation circuit have been described above with examples.

2. Technical Problems

Subsequently, technical problems of the activation circuit according to the above described comparative example will be described.

In the example illustrated in FIG. 1, the gate-source voltage $V_{gs}$ of the transistor $NM_{11}$, which is constituted as a Native-NMOS, is expressed by a calculation expression shown as (Expression 1) below.

$$V_{gs} = -R_{STUP} \times I_{BIAS} \quad \text{(Equation 1)}$$

Also, in order to cause the above described transistor $NM_{11}$ to transition to the non-conductive state, the above described gate-source voltage $V_{gs}$ has to be lower than the threshold voltage $V_{th}$ of the transistor $NM_{11}$ ($V_{gs} < V_{th}$). Thus, the condition shown below as (Expression 2) has to be satisfied.

$$-V_{th} < R_{STUP} \times I_{BIAS} \quad \text{(Expression 2)}$$

In view of the foregoing, when a circuit is to be implemented, in consideration of variations in the threshold voltage $V_{th}$ of the transistor $NM_{11}$, designing with a margin(s) is required so that at least one of the resistor $R_{STUP}$ and the bias current $I_{BIAS}$ illustrated in FIG. 1 has a sufficiently large value. The consideration for the margin may lead to, for example, increase in the size of the activation circuit or increase in the current consumption of the activation circuit.

Figure 4:
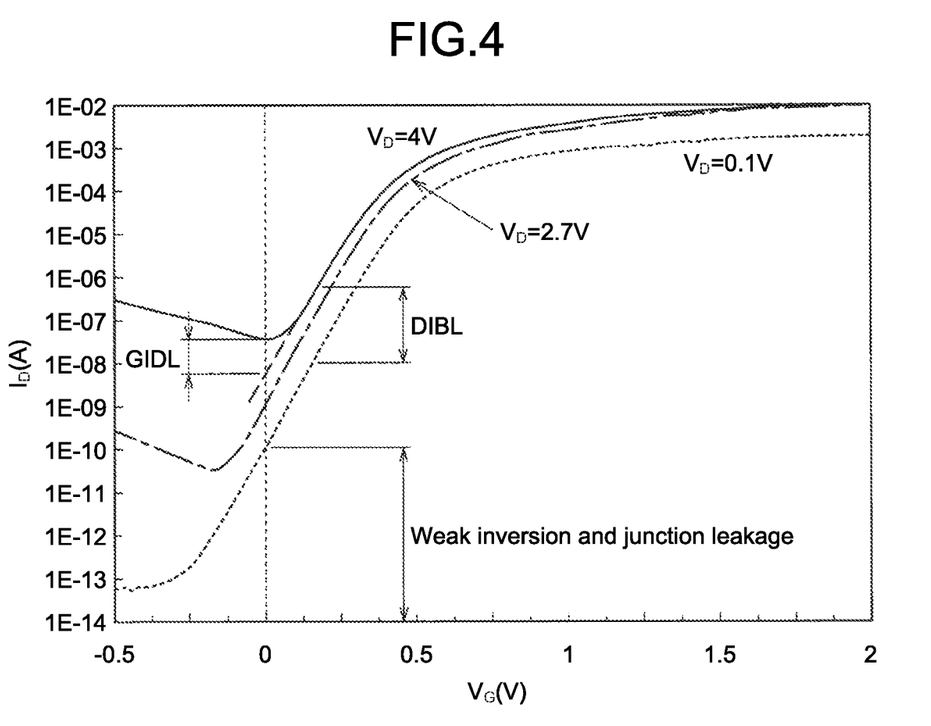
FIG. 4 is an explanatory diagram for describing outlines of GIDL.

Also, in a recent MOS transistor, if the gate-source voltage $V_{gs}$ is applied to a negative side, a phenomenon that the current between a drain and a back gate increases becomes noticeable in some cases due to gate-induced drain leakage (GIDL: Gate-Induced Drain Leakage). For example, FIG. 4 is an explanatory diagram for describing outlines of the GIDL and illustrates an example of the electric properties of a transistor. In FIG. 4, a horizontal axis represents a gate voltage $V_G$, and a vertical axis represents a drain current $I_D$. In the example illustrated in FIG. 4, the influence of the GIDL is noticeable in the region in which the gate voltage $V_G$ indicates a vicinity of 0 V. When the influence of the GIDL becomes noticeable in this manner, it becomes difficult to completely stop the flow of the activation current even after activation of a device serving as an activation target (for example, the current source circuit 200 illustrated in FIG. 1), and this causes increase in current consumption in some cases.

In view of the foregoing circumstances, the present disclosure proposes an activation circuit that is capable of reducing the above described variations among elements and the influence of the GIDL more and capable of realizing both of area reduction and current consumption reduction by a more preferred embodiment.

3. Technical Characteristics

Technical characteristics of an activation circuit according to an embodiment of the present disclosure will be described below.

3.1. Operation Principles

Figure 5:
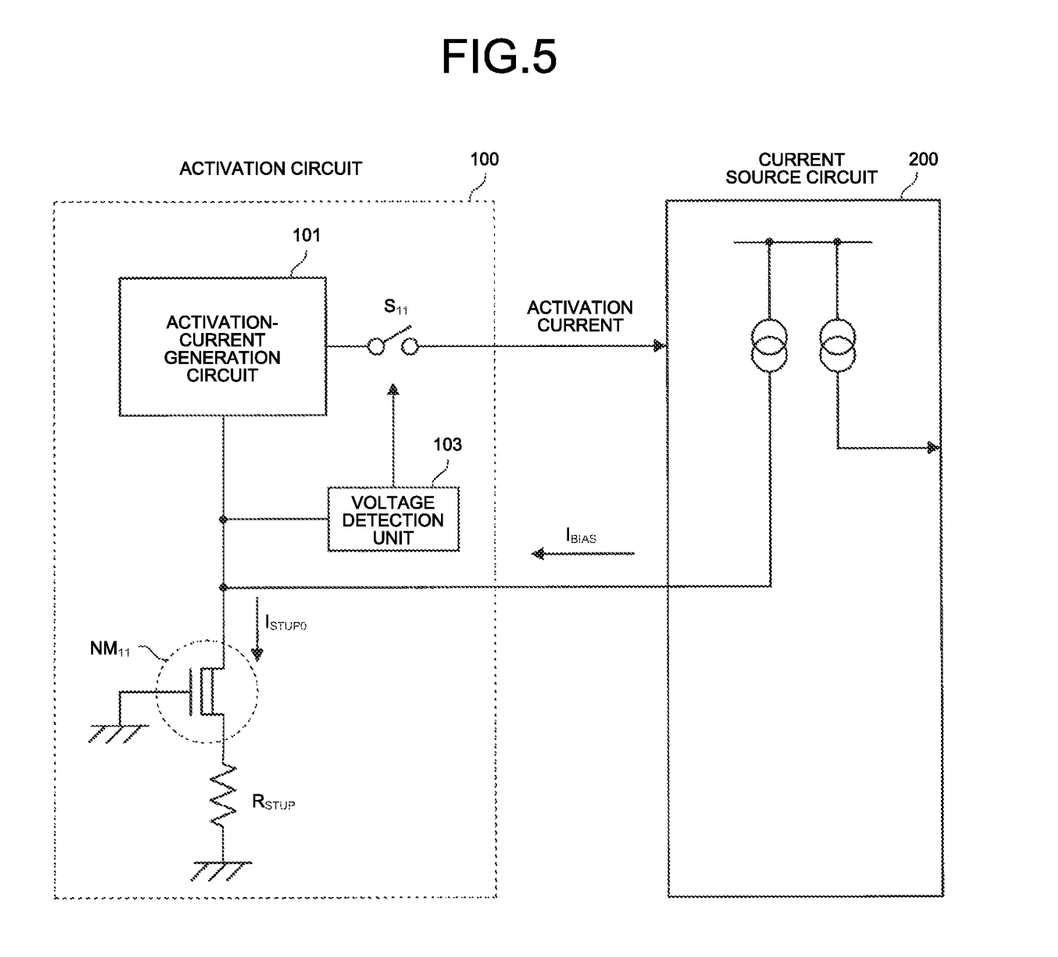
FIG. 5 is an explanatory diagram for describing outlines of operation principles of an activation circuit according to an embodiment of the present disclosure.

First, basic operation principles of the activation circuit according to the embodiment of the present disclosure will be described. For example, FIG. 5 is an explanatory diagram for describing outlines of the operation principles of the activation circuit according to the embodiment of the present disclosure and illustrates an example of a configuration abstracting the activation circuit as functional blocks. Note that, in the following description, the characteristics of an activation circuit 100 according to the embodiment of the present disclosure will be described by focusing on a case in which a current source circuit 200 serves as a drive target like the example described with reference to FIG. 1. Thus, detailed description about the current source circuit 200 illustrated in FIG. 5 will be omitted since the current source circuit is practically the same as the current source circuit 200 illustrated in FIG. 1.

As illustrated in FIG. 5, the activation circuit 100 includes a transistor $NM_{11}$, a resistor $R_{STUP}$, an activation-current generation circuit 101, a voltage detection unit 103, and a switch $S_{11}$. The transistor $NM_{11}$ is an N-type MOS transistor that is adjusted so that a threshold voltage is in a vicinity of 0 V. In other words, the transistor $NM_{11}$ has a property that, in a state in which no voltage is applied to a gate terminal thereof, a state between a source and a drain thereof is maintained in the conductive state. As a specific example, the transistor $NM_{11}$ can be constituted as a Native-NMOS. The transistor $NM_{11}$ has a gate terminal electrically connected to a ground (GND) and has a source terminal electrically connected to a ground (GND) via a resistor $R_{STUP}$. Also, the activation-current generation circuit 101 is connected to the drain terminal side of the transistor $NM_{11}$. Also, part of a signal line of the current source circuit 200 to which a bias current $I_{BIAS}$ generated by the current source circuit 200 serving as the drive target flows is electrically connected to the drain terminal of the transistor $NM_{11}$. In FIG. 5, a reference sign $I_{STUP0}$ schematically represents a drain current of the transistor $NM_{11}$.

The switch $S_{11}$ schematically represents a configuration which controls whether an activation current generated in the activation-current generation circuit 101 flows to the current source circuit 200 or not. Also, the voltage detection unit 103 schematically represents a configuration which controls the conductive state and the non-conductive state of the switch $S_{11}$. Specifically, the voltage detection unit 103 detects the electric potential of the drain terminal (in other words, drain voltage) of the transistor $NM_{11}$ and controls the conductive state and the non-conductive state of the switch $S_{11}$ depending on the result of the detection.

More specifically, if the drain voltage of the transistor $NM_{11}$ is lower than a predetermined threshold value, the voltage detection unit 103 carries out control so that the switch $S_{11}$ becomes the conductive state. As a result, the activation current (in other words, activation signal) generated in the activation-current generation circuit 101 flows to the current source circuit 200, and the current source circuit 200 is activated.

Also, along with activation of the current source circuit 200, part of the current output (output signal) from the current source circuit 200 flows to the drain terminal side of the transistor $NM_{11}$ as the bias current $I_{BIAS}$. As a result, the drain voltage of the transistor $NM_{11}$ increases. If the drain voltage of the transistor $NM_{11}$ becomes higher than the predetermined threshold value, the voltage detection unit 103 carries out control so that the switch $S_{11}$ becomes the non-conductive state. As a result, the flow of the activation current generated in the activation-current generation circuit 101 is restricted.

Hereinabove, the basic operation principles of the activation circuit according to the embodiment of the present disclosure has been described with reference to FIG. 5.

3.2. First Configuration Example

Figure 6:
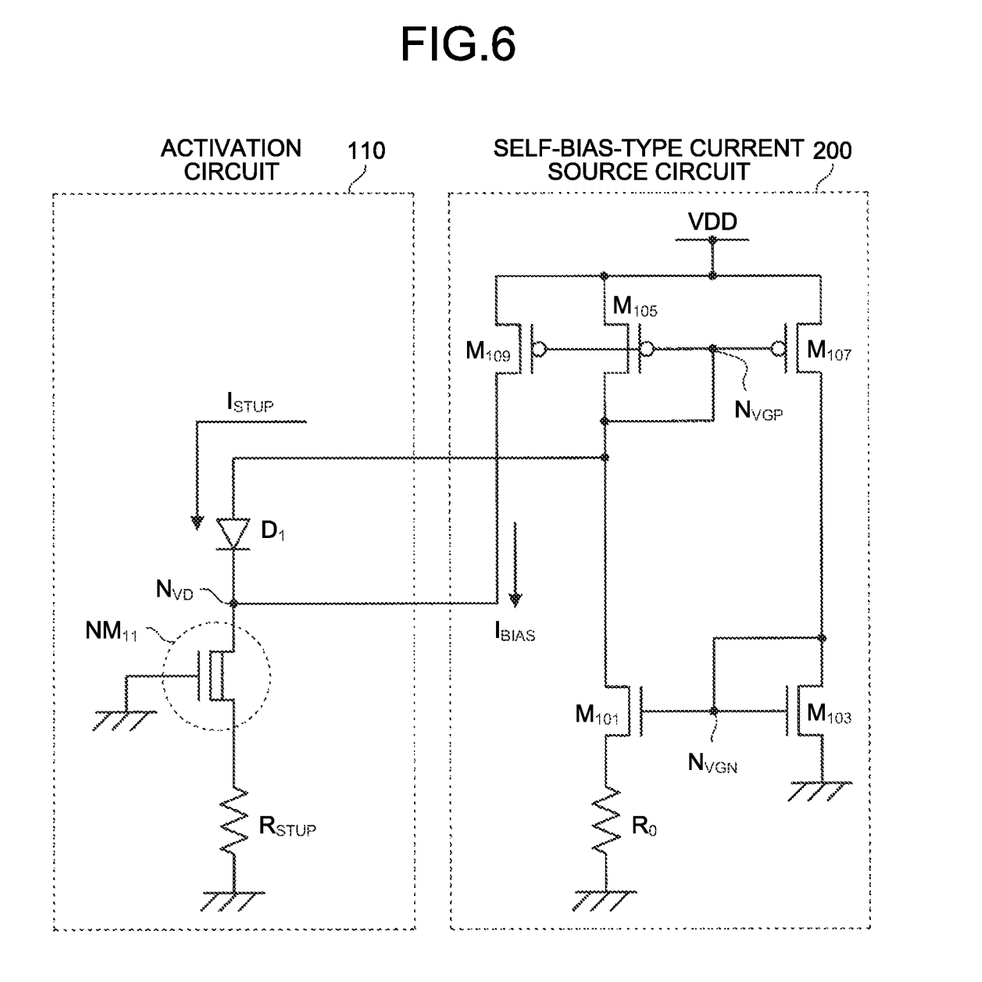
FIG. 6 is an explanatory diagram for describing a first configuration example of the activation circuit according to the embodiment.

Subsequently, a first configuration example of the activation circuit according to the embodiment of the present disclosure will be described. For example, FIG. 6 is an explanatory diagram for describing the first configuration example of the activation circuit according to the embodiment of the present disclosure and illustrates an example of a circuit configuration of the activation circuit illustrated in FIG. 5. Note that detailed description about the circuit configuration of a current source circuit 200 illustrated in FIG. 6 will be omitted since the circuit configuration is practically the same as the circuit configuration of the current source circuit 200 described with reference to FIG. 2. Also, an activation circuit 110 illustrated in FIG. 6 corresponds to the activation circuit 100 in the example illustrated in FIG. 5.

As illustrated in FIG. 6, the activation circuit 110 includes a transistor $NM_{11}$, a resistor $R_{STUP}$, and a diode $D_1$. The transistor $NM_{11}$ corresponds to the transistor $NM_{11}$ illustrated in FIG. 5. More specifically, the transistor $NM_{11}$ is, for example, constituted as a Native-NMOS, has a gate terminal electrically connected to a ground (GND), and has a source terminal electrically connected to a ground (GND) via the resistor $R_{STUP}$. Note that, in the case of such a circuit configuration, the current value of the drain current of the transistor $NM_{11}$ is the value obtained by dividing the gate-source voltage $V_{gs}$ by the resistor $R_{STUP}$.

A signal line branched from the drain terminal side of the transistor $M_{105}$ is electrically connected to the drain terminal side of the transistor $NM_{11}$ via the diode $D_1$. In this case, the diode $D_1$ has a cathode side electrically connected to the drain terminal of the transistor $NM_{11}$ and has an anode side electrically connected to the signal line branched from the drain terminal side of the transistor $M_{105}$. Also, the drain terminal side of the transistor $M_{109}$ is electrically connected to the drain terminal side of the transistor $NM_{11}$.

In such a configuration, when a power source voltage VDD is applied and the activation circuit 100 becomes an on-state, the activation current $I_{STUP}$ flows so that the current is pulled out from the current source circuit 200 to the activation circuit 100. Specifically, the activation current $I_{STUP}$ flows from the drain terminal side of the transistor $M_{105}$ to the drain terminal side of the transistor $NM_{11}$ via the diode $D_1$. As a result, the current source circuit 200 is activated.

Also, when the current source circuit 200 is activated, part of the current output (in other words, output signal) from the current source circuit 200 is supplied to the drain terminal side of the transistor $NM_{11}$ as a bias current $I_{BIAS}$, and the electric potential of the drain terminal side of the transistor $NM_{11}$ (in other words, the cathode side of the diode $D_1$) increases. In this case, the drain voltage of the transistor $NM_{11}$ can be increased to the power source voltage VDD by setting the current value of the bias current $I_{BIAS}$, which is set by the aspect ratio (W/L ratio) of the transistor $M_{105}$ and the transistor $M_{109}$, to have a value sufficiently larger than the current value of the drain current of the transistor $NM_{11}$, which is the value obtained by dividing the gate-source voltage $V_{gs}$ of the transistor $NM_{11}$ by the resistor $R_{STUP}$.

Along with increase in the electric potential of the cathode side of the diode $D_1$, the electric potential difference between the cathode side and the anode side of the diode $D_1$ becomes smaller, and the flow of the activation current $I_{STUP}$ is restricted. Then, when the electric potential of the cathode side of the diode $D_1$ becomes higher than the electric potential of the anode side and reverse bias is applied to the diode $D_1$, the flow of the activation current $I_{STUP}$ is shut off. In other words, the activation circuit 100 becomes an off-state. Also, the current value of the bias current $I_{BIAS}$ supplied from the current source circuit 200 to the drain terminal side of the transistor $NM_{11}$ in this case is restricted to be approximately equal to the current value of the drain current of the transistor $NM_{11}$, which is the minimum requisite current for maintaining the off-state of the activation circuit 100.

Figure 7:
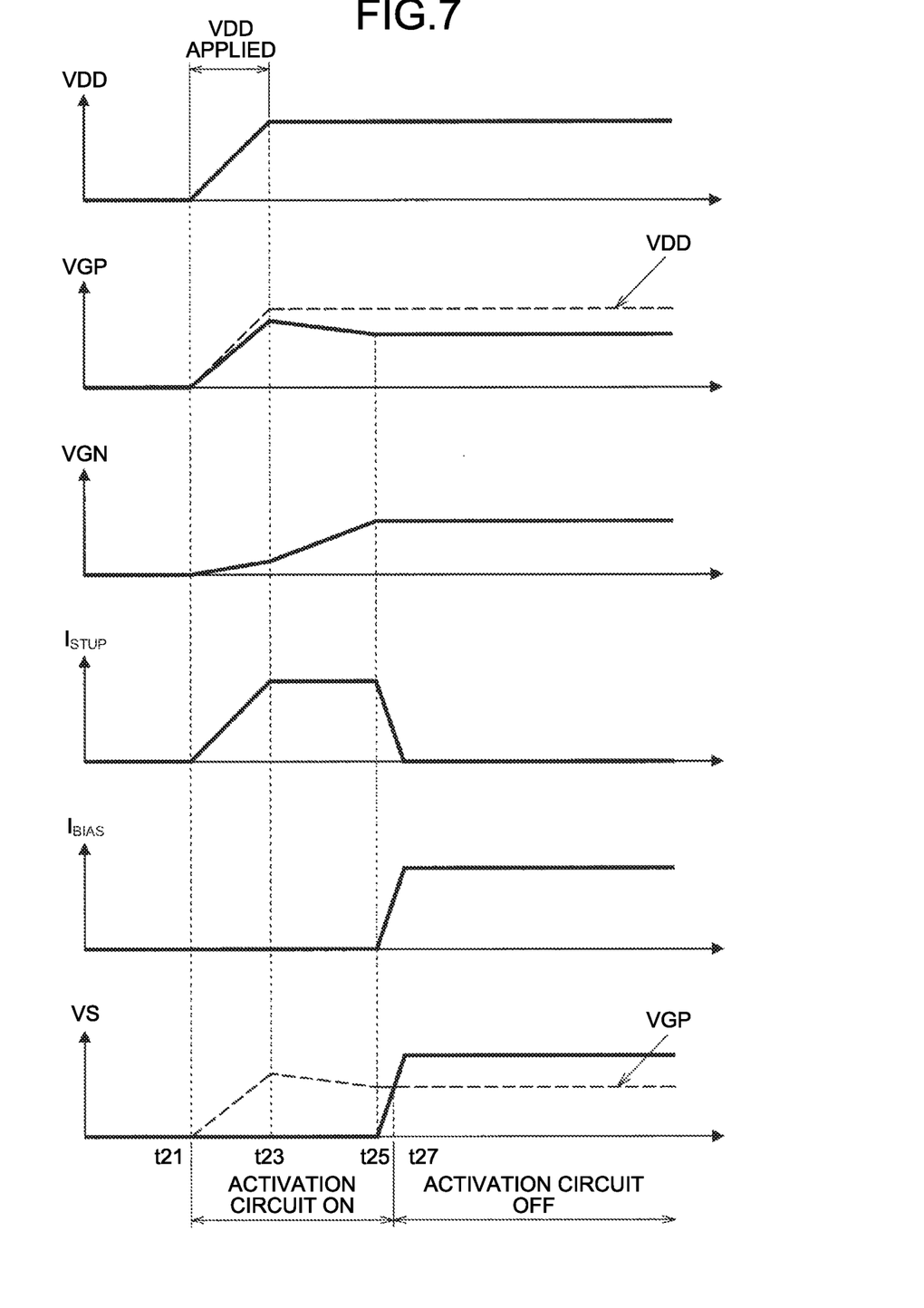
FIG. 7 is a timing chart for describing operation of the activation circuit according to the first configuration example.

Herein, with reference to FIG. 7, operation of the activation circuit 110 illustrated in FIG. 6, in other words, operation about activation of the current source circuit 200 will be described in more detail. FIG. 7 is a timing chart for describing the operation of the activation circuit 190 according to the first configuration example. Horizontal axes in FIG. 7 represent time. A reference sign VDD represents a voltage value of the power source voltage VDD illustrated in FIG. 6. A reference sign VGP represents the electric potential of a node $N_{VGP}$ in FIG. 6, in other words, the electric potential of gate terminals of the respective transistors $M_{105}$, $M_{107}$, and $M_{109}$, which constitute a current mirror circuit. A reference sign VGN represents the electric potential of a node $N_{VGN}$ in FIG. 6, in other words, the electric potential of gate terminals of respective transistors $M_{101}$ and $M_{103}$, which constitute a current mirror circuit. A reference sign $I_{STUP}$ represents the current value of the activation current $I_{STUP}$ illustrated in FIG. 6. A reference sign $I_{BIAS}$ represents the current value of the bias current $I_{BIAS}$ illustrated in FIG. 6. A reference sign VD represents the electric potential of a node $N_{VD}$ in FIG. 6, in other words, the electric potential of the drain terminal of the transistor $NM_{11}$.

In the example illustrated in FIG. 7, the power source voltage VDD is applied at timing t21, and the voltage value of the power source voltage VDD increases in the period from the timing t21 to timing t23. Note that, at this point of time, the electric potential VD of the drain terminal of the transistor $NM_{11}$ indicates a vicinity of 0 V.

When the power source voltage VDD is applied, the activation circuit 100 becomes the on-state, the activation current $I_{STUP}$ flows so that the current is pulled out from the current source circuit 200 to the activation circuit 100. In this process, the current value of the activation current $I_{STUP}$ increases along with increase in the voltage value of the power source voltage VDD, and the electric potential VGP of the node $N_{VGP}$ increases along with increase in the current value of the activation current $I_{STUP}$. Then, when the gate-source voltage sufficiently exceeds a threshold voltage in each of the transistors $M_{105}$, $M_{107}$, and $M_{109}$, each of the transistors $M_{105}$, $M_{107}$, and $M_{109}$ transitions to the conductive state. For example, in the example illustrated in FIG. 7, at the timing t23, the transistors $M_{105}$, $M_{107}$, and $M_{109}$ transition to the conductive state, and increase in the power source voltage VDD stops. Also, when the transistor $M_{107}$ transitions to the conductive state at the timing t23, the electric potential VGN of the node $N_{VGN}$ electrically connected to the drain terminal side of the transistor $M_{107}$ increases, and the electric potential VGP decreases along with the increase in the electric potential VGN. Also, along with the increase in the electric potential VGN of the node $N_{VGN}$, the transistors $M_{101}$ and $M_{103}$ transition to the conductive state at timing t25, and the increase in the electric potential VGN and the decrease in the electric potential VGP stop. As described above, the activation of the current source circuit 200 is completed, and the signal (drain current) flows between the source and the drain of each of the transistors M101, $M_{103}$, $M_{105}$, $M_{107}$, and $M_{109}$, which constitute the current source circuit 200.

When the activation of the current source circuit 200 is completed at the timing t25, the signal transmitted between the source and the drain of the transistor $M_{109}$ is supplied to the drain terminal (in other words, the node $N_{VD}$) of the transistor $NM_{11}$ as the bias current $I_{BIAS}$. Along with this supply of the bias current $I_{BIAS}$, the electric potential VD of the drain terminal (node $N_{VD}$) of the transistor $NM_{11}$ increases. Note that the electric potential VD also corresponds to the cathode-side electric potential of the diode $D_1$ as illustrated in FIG. 6. On the other hand, the anode-side electric potential of the diode $D_1$ corresponds to the electric potential of the drain terminal side of the transistor $M_{105}$, in other words, corresponds to the electric potential VGP of the node $N_{VGP}$.

When the electric potential VD of the node $N_{VD}$ (in other words, the cathode-side electric potential of the diode $D_1$) increases along with supply of the bias current $I_{BIAS}$, the electric potential difference between the anode side and the cathode side of the diode $D_1$ becomes smaller, and the flow of the activation current $I_{STUP}$ is restricted. Then, when the cathode-side electric potential (electric potential VE) of the diode $D_1$ becomes higher than the anode-side electric potential (electric potential VGP), reverse bias is applied to the diode $D_1$. For example, in the example illustrated in FIG. 7, the electric potential VE is higher than the electric potential VGP at timing t27 and thereafter. Therefore, at the timing t27 and thereafter, the flow of the activation current $I_{STUP}$ is shut off. In other words, the activation circuit 110 becomes an off-state.

As described above, the activation circuit 110 according to the first configuration example can increase the drain voltage of the transistor $NM_{11}$ with minimum requisite current consumption, and the flow of the activation current $I_{STUP}$ is therefore shut off when a state in which reverse bias is applied to the diode $D_1$ is achieved. By virtue of such characteristics, the activation circuit 110 according to the first configuration example can further reduce the influence of the variation among elements (for example, threshold value variations) of the transistor $NM_{11}$ compared with the activation circuit 190 according to the comparative example. Therefore, in designing of the activation circuit 110 according to the first configuration example, the necessity of considering margins of the resistor and current consumption is ideally eliminated. Moreover, since the flow of the activation current $I_{STUP}$ is configured to be shut off depending on the increase in the drain voltage of the transistor $NM_{11}$, the influence of the GIDL on the device which serves as the activation target can be further reduced (ideally, the influence is eliminated).

Hereinabove, the first configuration example of the activation circuit according to the embodiment of the present disclosure has been described with reference to FIG. 6 and FIG. 7.

3.3. Second Configuration Example

Figure 8:
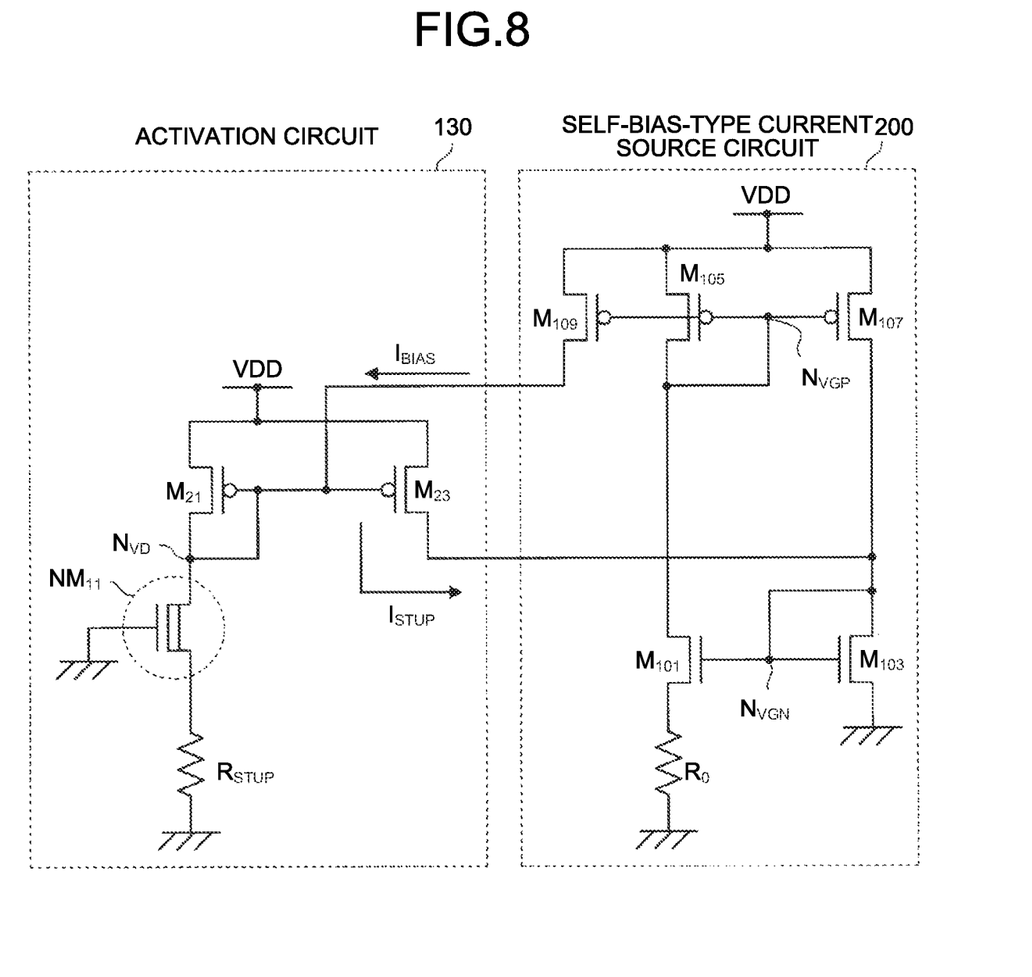
FIG. 8 is an explanatory diagram for describing a second configuration example of the activation circuit according to the embodiment.

Subsequently, a second configuration example of the activation circuit according to the embodiment of the present disclosure will be described. For example, FIG. 8 is an explanatory diagram for describing the second configuration example of the activation circuit according to the embodiment of the present disclosure and illustrates an example of a circuit configuration of the activation circuit illustrated in FIG. 5. Note that detailed description about the circuit configuration of a current source circuit 200 illustrated in FIG. 8 will be omitted since the circuit configuration is practically the same as the circuit configuration of the current source circuit 200 described with reference to FIG. 2. Also, an activation circuit 130 illustrated in FIG. 8 corresponds to the activation circuit 100 in the example illustrated in FIG. 5.

As illustrated in FIG. 8, the activation circuit 130 includes a transistor $NM_{11}$, a resistor $R_{STUP}$, and transistors $M_{21}$ and $M_{23}$. The transistor $NM_{11}$ corresponds to the transistor $NM_{11}$ illustrated in FIG. 5. More specifically, the transistor $NM_{11}$ is, for example, constituted as a Native-NMOS, has a gate terminal electrically connected to a ground (GND), and has a source terminal electrically connected to a ground (GND) via the resistor $R_{STUP}$. Note that, in the case of such a circuit configuration, the current value of the drain current of the transistor $NM_{11}$ is the value obtained by dividing the gate-source voltage $V_{gs}$ by the resistor $R_{STUP}$.

The transistors $M_{21}$ and $M_{23}$ constitute a current mirror circuit. In the activation circuit 130, the current obtained by mirroring the drain current of the transistor $NM_{11}$ using the current mirror circuit is supplied to the current source circuit 200 as an activation current $I_{STUP}$.

Specifically, each of the transistors $M_{21}$ and $M_{23}$ is constituted as a P-type MOS transistor, and gate terminals thereof are electrically connected to each other. The gate and the drain of the transistor $M_{21}$ are electrically connected to each other. Each of source terminals of the transistors $M_{21}$ and $M_{23}$ is electrically connected to a power source voltage VDD. Also, a drain terminal of the transistor $M_{21}$ and a drain terminal of the transistor $NM_{11}$ are electrically connected to each other.

Also, a drain terminal side of a transistor $M_{109}$ is electrically connected to the gate terminals of the respective transistors $M_{21}$ and $M_{23}$, which constitute the current mirror circuit. In other words, the drain terminal of the transistor $M_{109}$ and the drain terminal of the transistor $NM_{11}$ are electrically connected to each other. Also, a drain terminal of the transistor $M_{23}$ and a drain terminal of the transistor $M_{103}$ (in other words, a drain terminal of a transistor $M_{107}$) are electrically connected to each other. Thus, the drain terminal of the transistor $M_{21}$ and gate terminals of the respective transistors $M_{101}$ and $M_{103}$, which constitute a current mirror circuit, are electrically connected to each other.

In such a configuration, when the power source voltage VDD is applied and the activation circuit 130 becomes an on-state, the drain current flows to the transistor $NM_{11}$, which is in the conductive state, and the current obtained by mirroring the drain current using the current mirror circuit is supplied to the current source circuit 200 as the activation current $I_{STUP}$.

The activation current $I_{STUP}$ from the activation circuit 130 is supplied to the gate terminals (in other words, a node $N_{VGN}$) of the respective transistors $M_{101}$ and $M_{103}$, which constitute the current mirror circuit, and the transistors $M_{101}$ and $M_{103}$ transition to the conductive state. As a result, gate terminals of respective transistors $M_{105}$, $M_{107}$, and $M_{109}$, which constitute a current mirror circuit, (in other words, a node $N_{VGP}$) are electrically connected to a ground (GND) via the transistor $M_{101}$ and a resistor $R_0$. Therefore, the transistors $M_{105}$, $M_{107}$, and $M_{109}$, which constitute the current mirror circuit, transition to the conductive state. In this manner, activation of the current source circuit 200 is completed by first activating the current mirror circuit, which is constituted by the N-type MOS transistors $M_{101}$ and $M_{103}$, along with supply of the activation current $I_{STUP}$ from the activation circuit 130 and then activating the current mirror circuit, which is constituted by the P-type MOS transistors $M_{105}$, $M_{107}$, and $M_{109}$.

Moreover, when the current source circuit 200 is activated, part of the current output (in other words, output signal) from the current source circuit 200 is supplied as a bias current $I_{BIAS}$ to the gate terminals of the respective transistors $M_{21}$ and $M_{23}$, which constitute the current mirror circuit. As a result, the electric potential of the gate terminals of the respective transistors $M_{21}$ and $M_{23}$ increases. Therefore, the electric potential of the drain terminal of the transistor $NM_{11}$, which is electrically connected to the gate terminals, (in other words, the electric potential of a node $N_{VD}$) also increases. In this case, the drain voltage of the transistor $NM_{11}$ (in other words, the gate voltages of the respective transistors $M_{21}$ and $M_{23}$) can be increased to the power source voltage VDD by setting the current value of the bias current $I_{BIAS}$, which is set by the aspect ratio (W/L ratio) of the transistor $M_{105}$ and the transistor $M_{109}$, to have a value sufficiently larger than the current value of the drain current of the transistor $NM_{11}$, which is the value obtained by dividing the gate-source voltage $V_{gs}$ of the transistor $NM_{11}$ by the resistor $R_{STUP}$.

Then, when the gate-source voltage becomes sufficiently lower than a threshold voltage in each of the transistors $M_{21}$ and $M_{23}$, each of the transistors $M_{21}$ and $M_{23}$ transitions to the non-conductive state. When the transistor M23 transitions to the non-conductive state in this manner, the supply of the activation current $I_{STUP}$ from the activation circuit 130 to the current source circuit 200 is shut off. Also, the current value of the bias current $I_{BIAS}$ supplied from the current source circuit 200 to the drain terminal side of the transistor $NM_{11}$ in this case is restricted to be approximately equal to the current value of the drain current of the transistor $NM_{11}$, which is the minimum requisite current for maintaining the off-state of the activation circuit 130.

As described above, the activation circuit 130 according to the second configuration example can increase the drain voltage of the transistor $NM_{11}$ (in other words, the gate voltages of the respective transistors $M_{21}$ and $M_{23}$) with minimum requisite current consumption, and the flow of the activation current $I_{STUP}$ is therefore shut off when the transistor $M_{23}$ is caused to transition to the non-conductive state. By virtue of such characteristics, the activation circuit 130 according to the second configuration example can further reduce the influence of the variation among elements (for example, threshold value variations) of the transistor $NM_{11}$ compared with the activation circuit 190 according to the comparative example. Therefore, in designing of the activation circuit 130 according to the second configuration example, the necessity of considering margins of the resistor and current consumption is ideally eliminated. Moreover, since the flow of the activation current $I_{STUP}$ is configured to be shut off depending on the increase in the drain voltage of the transistor $NM_{11}$, the influence of the GIDL on the device which serves as the activation target can be further reduced (ideally, the influence is eliminated). Also, in the activation circuit 130 according to the second configuration example, among the components of the self-bias-type current source circuit, the current mirror circuit constituted by NMOS is activated first, and the current mirror circuit constituted by PMOS is then activated. Then, the current source circuit is activated. As a result, the bias current, which is output of the current source circuit, is supplied to the activation circuit 130, and the supply of the activation current from the activation circuit 130 to the current source circuit is shut off. When operation is carried out in such a manner, the current source circuit can be more reliably activated.

Hereinabove, the second configuration example of the activation circuit according to the embodiment of the present disclosure has been described with reference to FIG. 8.

3.4. Supplementary Notes

Hereinabove, the description has been given by focusing mainly on the example of the case in which the activation current $I_{STUP}$ generated in the activation circuit 100 is caused to flow to the device serving as the drive target (for example, the current source circuit 200) to activate the device. On the other hand, as long as the device serving as the drive target can be activated, the activation signal supplied from the activation circuit 100 to the device is not necessarily limited to a current. For example, the device may be activated by transmitting a voltage signal, which has been generated in the activation circuit 100, as the activation signal to the device serving as the drive target.

Moreover, in the above description, the activation circuit 100 is stopped by supplying part of the current flowing in the device serving as the drive target, in other words, part of the current output from the device as the bias current to the drain terminal of the transistor $NM_{11}$ to control the electric potential of the drain terminal (in other words, the drain voltage). On the other hand, as long as the drain voltage of the transistor $NM_{11}$ can be controlled, the bias signal supplied from the device serving as the drive target to the drain terminal of the transistor $NM_{11}$ (in other words, the signal output from the device) is not necessarily limited to a current. For example, the drain voltage of the transistor $NM_{11}$ may be controlled by supplying part of the voltage signal, which has been generated in the device serving as the drive target, as the bias signal to the drain terminal of the transistor $NM_{11}$.

Moreover, the configurations described above as the first configuration example and the second configuration example are merely examples. As long as the operation principles described with reference to FIG. 5 can be realized, the circuit configuration of the activation circuit according to the embodiment of the present disclosure is not limited. Moreover, as described above, also in the case in which the voltage signal is transmitted as the activation signal or the bias signal, the circuit configuration of the activation circuit according to the embodiment of the present disclosure may be appropriately changed within the range not departing from the gist of the operation principles described with reference to FIG. 5.

4. Conclusion

As described above, the activation circuit according to the embodiment of the present disclosure is provided with an N-type MOS transistor having a gate terminal connected to a ground and having a threshold voltage in a vicinity of 0 V and is provided with a resistor interposed between a source terminal of the above described MOS transistor and a ground. Moreover, in the activation circuit, an electric potential of a drain terminal of the above described MOS transistor is controlled depending on a first signal output from a device serving as a drive target, and transmission of a second signal (activation signal) for activating the above described device is controlled depending on the electric potential of the above described drain terminal. Examples of the above described MOS transistor include a Native-NMOS.

According to the above described configurations, in the activation circuit according to the embodiment of the present disclosure, a drain voltage of the above described MOS transistor, which constitutes the activation circuit, can be reliably increased with current consumption which is minimum requisite for maintaining the activation circuit in an off-state. By virtue of this, ideally, the margins of resistance and current consumption that support the variations among the elements (for example, the above described MOS transistor) constituting the activation circuit are not required to be taken into consideration. Therefore, both of area reduction and current consumption reduction can be realized by more preferred embodiments. Moreover, the transmission of the activation signal, which is for activating the device serving as the drive target, can be more reliably restricted depending on the increase in the drain voltage. Therefore, the influence of the GIDL on the circuit which is the target to be activated (in other words, the device serving as the drive target) can be reduced more (ultimately, the influence is eliminated).

The preferred embodiments of the present disclosure have been described in detail hereinabove with reference to the accompanying drawings, but the technical scope of the present disclosure is not limited to such examples. It is apparent that a person having ordinary knowledge in the technical field of the present disclosure can conceive of various changes or modifications within the scope of the technical idea described in the claims, and it is understood that the changes or modifications also belong to the technical scope of the present disclosure.

Furthermore, the effects described in the present specification are merely illustrative or exemplary and are not limitative. That is, the technology according to the present disclosure can exhibit other effects obvious to those skilled in the art from the description of the present specification in addition to or in place of the above described effects.

Note that the following configurations also belong to the technical scope of the present disclosure.

(1)

An activation circuit comprising:

an N-type MOS transistor having a gate terminal connected to a ground and having a threshold voltage in a vicinity of 0 V; and a resistor interposed between a source terminal of the MOS transistor and a ground, wherein an electric potential of a drain terminal of the MOS transistor is controlled depending on a first signal output from a device serving as a drive target, and transmission of a second signal for activating the device is controlled depending on the electric potential of the drain terminal.

(2)

The activation circuit according to (1), wherein the second signal flowing in the device is pulled into the drain terminal via a diode depending on the electric potential of the drain terminal, and the pulling of the second signal into the drain terminal via the diode is restricted depending on supply of the first signal to the drain terminal.

(3)

The activation circuit according to (2), wherein the drain terminal is connected to a cathode of the diode, the second signal is pulled into the drain terminal via the diode from an anode side of the diode, the pulling of the second signal into the drain terminal via the diode is restricted depending on increase in the electric potential of the drain terminal that depends on supply of the first signal to the drain terminal.

(4)

The activation circuit according to (1) or (2), further comprising a current mirror circuit having an input terminal and an output terminal, wherein the drain terminal is connected to the input terminal, the electric potential of the drain terminal is controlled depending on supply of the first signal to the current mirror circuit, and supply of the second signal to the device is restricted depending on the electric potential of the drain terminal.

(5)

The activation circuit according to (4), wherein the electric potential of the drain terminal is controlled depending on supply of the first signal to a gate terminal of a transistor that constitutes the current mirror circuit.

(6)

The activation circuit according to any one of (1) to (5), wherein the first signal is a current or voltage signal.

(7)

The activation circuit according to any one of (1) to (6), wherein the second signal is a current or voltage signal.

(8)

The activation circuit according to any one of (1) to (7), wherein the device is a current source circuit.

(9)

The activation circuit according to (8), wherein the device is the current source circuit of a self-bias type, and part of the first signal flowing in the current source circuit is supplied to the drain terminal.

REFERENCE SIGNS LIST 100, 110, 130 ACTIVATION CIRCUIT
101 ACTIVATION-CURRENT GENERATION CIRCUIT
103 VOLTAGE DETECTION UNIT
200 CURRENT SOURCE CIRCUIT
$NM_{11}$ N-TYPE MOS TRANSISTOR
$R_{STUP}$ RESISTOR

The invention claimed is:

1. An activation circuit, comprising:

an N-type MOS transistor having a gate terminal directly connected to a ground and having a threshold voltage in a vicinity of 0 V; and a resistor interposed between a source terminal of the MOS transistor and the ground, wherein an electric potential of a drain terminal of the MOS transistor is controlled based on a first signal output from a device serving as a drive target, and a second signal is transmitted from the device to the drain terminal to activate the device and is controlled based on the electric potential of the drain terminal.

2. An activation circuit, comprising:

an N-type MOS transistor having a gate terminal connected to a ground and having a threshold voltage in a vicinity of 0 V; and a resistor interposed between a source terminal of the MOS transistor and the ground, wherein an electric potential of a drain terminal of the MOS transistor is controlled based on a first signal output from a device serving as a drive target, transmission of a second signal to activate the device is controlled based on the electric potential of the drain terminal, the second signal flowing from the device is pulled into the drain terminal via a diode based on the electric potential of the drain terminal, and the pulling of the second signal into the drain terminal via the diode is restricted based on supply of the first signal to the drain terminal.

3. The activation circuit according to claim 2, wherein the drain terminal is connected to a cathode of the diode, the second signal is pulled into the drain terminal via the diode from an anode side of the diode, and the pulling of the second signal into the drain terminal via the diode is restricted based on increase in the electric potential of the drain terminal that depends on supply of the first signal to the drain terminal.

4. The activation circuit according to claim 1, further comprising a current mirror circuit having an input terminal and an output terminal, wherein the drain terminal is connected to the input terminal, the electric potential of the drain terminal is controlled based on supply of the first signal to the current mirror circuit, and supply of the second signal to the device is restricted based on the electric potential of the drain terminal.

5. The activation circuit according to claim 4, wherein the electric potential of the drain terminal is controlled based on supply of the first signal to a gate terminal of a transistor that constitutes the current mirror circuit.

6. The activation circuit according to claim 1, wherein the first signal is a current or voltage signal.

7. The activation circuit according to claim 1, wherein the second signal is a current or voltage signal.

8. The activation circuit according to claim 1, wherein the device is a current source circuit.

9. The activation circuit according to claim 8, wherein
the device is the current source circuit of a self-bias type, and
a part of the first signal that flows in the current source circuit is supplied to the drain terminal.

\* \* \* \* \*